United States Patent
Ko et al.

(10) Patent No.: US 8,405,921 B2
(45) Date of Patent: Mar. 26, 2013

(54) PIEZO ACTUATOR AND LENS ACTUATING MODULE USING THE SAME

(75) Inventors: Hyun Phill Ko, Gyunggi-do (KR); Won Seob Oh, Gyunggi-do (KR); Jae Hyuk Park, Seoul (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 330 days.

(21) Appl. No.: 12/609,954

(22) Filed: Oct. 30, 2009

(65) Prior Publication Data

US 2011/0063743 A1    Mar. 17, 2011

(30) Foreign Application Priority Data

Sep. 17, 2009    (KR) .................. 10-2009-0088163

(51) Int. Cl.
    *G02B 7/02* (2006.01)
(52) U.S. Cl. ........................................ 359/824
(58) Field of Classification Search .......... 359/824; 310/367
    See application file for complete search history.

(56) References Cited

U.S. PATENT DOCUMENTS

| 6,215,605 | B1 | 4/2001 | Kuwana et al. |
| 2010/0085649 | A1* | 4/2010 | Wischnewskij et al. ...... 359/698 |

FOREIGN PATENT DOCUMENTS

KR    102008010478    12/2008

OTHER PUBLICATIONS

Office Action from counterpart Korean Patent Application No. 10-2009-0088163, Jan. 28, 2011, 4 pages.

* cited by examiner

*Primary Examiner* — Joseph P Martinez
(74) *Attorney, Agent, or Firm* — Blakely Sokoloff Taylor & Zafman LLP

(57) ABSTRACT

Disclosed herein are a piezo actuator and a lens actuating module using the piezo actuator. The lens actuating module includes a housing having an accommodating space. A lens barrel is accommodated in the accommodating space. A preload unit includes a locking part locked to the outer circumference of the lens barrel and preload parts extending from both edges of the locking part outwards relative to the lens barrel. A piezo actuator is interposed between the preload parts and supported at a side thereof by force of the preload parts, the side being bent and deformed inwards and outwards, thus applying force for actuating the lens barrel in a direction of an optical axis to the preload unit. The piezo actuator which is simple in structure and assembling process and has improved actuating reliability and the lens actuating module using the piezo actuator are achieved.

9 Claims, 8 Drawing Sheets

PIEZO ACTUATOR AND LENS ACTUATING MODULE USING THE SAME

CROSS REFERENCE TO RELATED APPLICATION

This application claims the benefit of Korean Patent Application No. 10-2009-0088163, filed on Sep. 17, 2009, entitled "Piezo Actuator And Lens Actuating Module Using The Same", which is hereby incorporated by reference in its entirety into this application.

BACKGROUND OF THE INVENTION

1. Technical Field

The present invention relates to a piezo actuator and a lens actuating module using the piezo actuator.

2. Description of the Related Art

Generally, personal portable terminals such as electronic devices, mobile phones or PDAs have additional functions as well as a main function. Currently, many electronic devices additionally have a camera function to make them appeal to consumers. Thus, a market for camera modules mounted on the electronic devices has been gradually expanding.

In order to satisfy the demand of the market, the camera module has been developed to have additional functions including an auto-focusing function, an optical zoom function, and an Optical Image Stabilization (OIS) function, in addition to a fixed focus function.

Especially, in order to realize the additional functions of the camera module including the auto-focusing function, the optical zoom function, and the OIS function, a lens actuating module using an actuator for transferring a lens, for example, an actuator of a step motor type, a Voice Coil Motor (VCM) type, or a piezoelectric type is essentially required. In recent years, as the personal portable terminals require the composition of multiple functions and miniaturization, the camera module applied to the personal portable terminal mainly uses the piezoelectric type which is advantageous in terms of miniaturization and reliability.

A lens actuating module using piezoelectric elements is shown in FIGS. 1 and 2. FIG. 1 is a view illustrating the lens actuating module disclosed in U.S. Pat. No. 6,215,605. In the conventional lens actuating module, piezoelectric elements 11 and 12 are fixed to base blocks 21 and 22 and displacement is transmitted to driving rods 16 and 17, so that lenses L2 and L4 are transferred by preload generated from slide parts 31a and 32a, inertia force of lens holders 31 and 32, and acceleration effect. According to the waveform of voltage applied to the piezoelectric element 12, the lens holder moves along with the driving rod or slides so that it can retain its position, and thereby the lens is transferred. Further, the lens may be transferred in opposite directions.

When the lens actuating module of FIG. 1 is arranged in the configuration of FIG. 2, and the displacement of one of the piezoelectric elements 11a and 11b which are arranged to be adjacent to each other is transmitted through a base block 13, the displacement may be undesirably transmitted to another lens.

Thus, a groove 13g is formed in the base block 13 so as to prevent the transmission of displacement between piezoelectric elements. Such a groove complicates the structure, causes the lens actuating module to be difficult to manufacture, and cannot completely solve displacement interference between the piezoelectric elements.

Further, the length of each driving rod 16 or 17 which is moved forwards and backwards through the piezoelectric element 12 to transfer the lens is limited by the size of the piezoelectric element. The length restriction of the driving rods 16 and 17 limits the lens transfer length, so that it negatively affects the performance of a product.

Since the driving rods 16 and 17 are fixed, it is impossible to change the length of a barrel in which the lens is held. In addition to a space for the lens transfer length, an additional space for receiving driving elements is required, so that it is difficult to realize the miniaturization of an entire module. Further, only one end of the lens is supported by each driving rod 16 or 17, so that the lens has asymmetric displacement when the lens actuating module is driven, thus leading to unstable driving.

SUMMARY OF THE INVENTION

The present invention is intended to provide a piezo actuator which is capable of simplifying the actuating mechanism of a lens barrel and improving the reliability of actuation by changing the design of the piezo actuator, and a lens actuating module using the piezo actuator.

In an exemplary piezo actuator according to an embodiment of the present invention, a plate comprises a piezoelectric material which is divided into two parts each having an independent electrode, and has a shape of a box. A guide is provided on each of opposite sides of the plate. When power is applied to the piezoelectric material, a side of the plate is bent and deformed inwards and outwards relative to the plate, so that actuating force is generated in a longitudinal direction of the plate.

The guide may be integrated with the plate, or may be manufactured separately from the plate and secured to the plate.

Further, the outer portion of the guide may have a round structure.

In an exemplary lens actuating module according to an embodiment of the present invention, a housing has an accommodating space. A lens barrel is accommodated in the accommodating space, and includes at least one lens. A preload unit includes a locking part locked to an outer circumference of the lens barrel, and preload parts extending from both edges of the locking part outwards relative to the lens barrel. A piezo actuator is interposed between the preload parts and supported at a side thereof by force of the preload parts, the side being bent and deformed inwards and outwards, thus applying force for actuating the lens barrel in a direction of an optical axis to the preload unit.

The housing may include at a corner thereof an opening such that the preload unit and the piezo actuator are disposed in the opening.

Further, a barrel support part may be provided on the outer circumference of the lens barrel in such a way as to protrude outwards and extend in the direction of the optical axis, and a housing guide part may be provided in the housing to engage with and guide the barrel support part.

Further, a bush guide may be provided in the housing in such a way as to extend in the direction of the optical axis of the lens barrel, and a barrel bush may be provided on the outer circumference of the lens barrel so that the bush guide is inserted into the barrel bush to guide the lens barrel.

The barrel bush may protrude from an upper end of the outer circumference of the lens barrel, and may include an open hole into which the bush guide is inserted.

The locking part of the preload unit may be supported by the barrel support part which protrudes outwards from the outer circumference of the lens barrel and extends in the direction of the optical axis.

Further, the locking part of the preload unit may be attached to the outer circumference of the lens barrel using an adhesive.

The piezo actuator may include a plate comprising a piezoelectric material which is divided into two parts each having an independent electrode and having a shape of a box, and a guide provided on each of opposite sides of the plate and contacting with and supported by an associated preload part. When power is applied to the piezoelectric material, a side of the plate may be bent and deformed inwards and outwards relative to the plate, so that force for actuating the lens barrel in the direction of the optical axis may be applied through the guide to the preload part.

Further, the guide may be integrated with the plate, or may be manufactured separately from the plate and secured to the plate.

Furthermore, a contact portion of the guide with the preload part may have a round structure.

DESCRIPTION OF THE PREFERRED EMBODIMENTS

Figure 1:
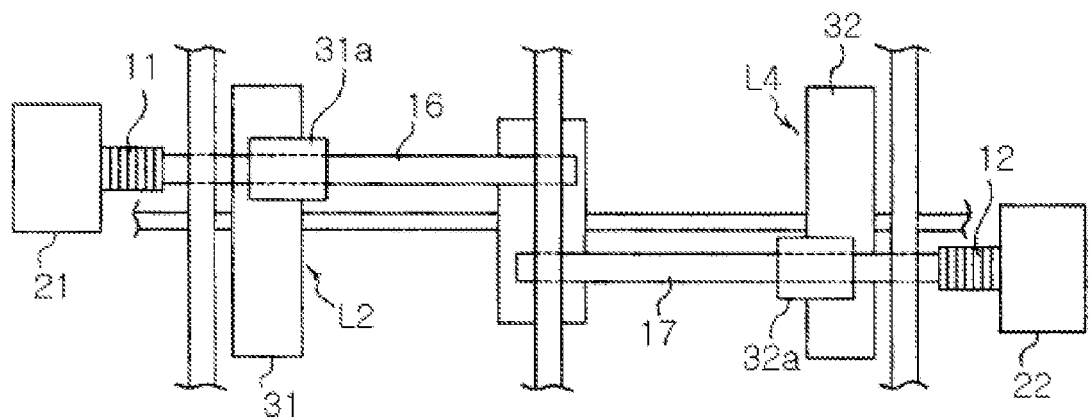
FIG. 1 is a sectional view illustrating a conventional lens actuating module using piezoelectric elements.
Figure 2:
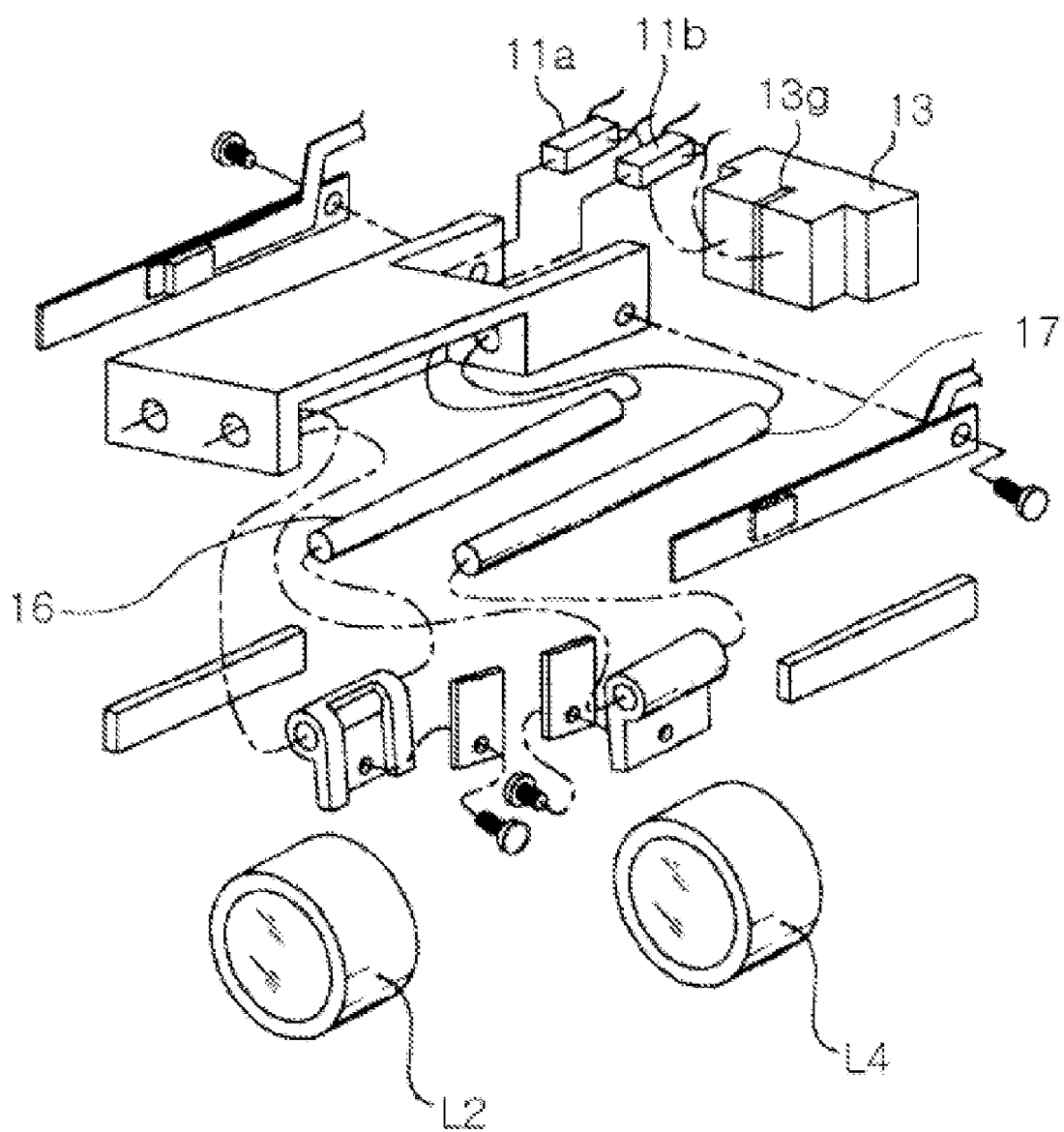
FIG. 2 is a view illustrating the assembly of the lens actuating module of FIG. 1.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the terms to describe most appropriately the best method he or she knows for carrying out the invention.

The above and other objects, features and advantages of the present invention will be more clearly understood from the following detailed description taken in conjunction with the accompanying drawings. Herein, the same reference numerals are used throughout the different drawings to designate the same components. Further, when it is determined that the detailed description of the known art related to the present invention might obscure the gist of the present invention, the detailed description thereof will be omitted.

Hereinafter, the preferred embodiments of the present invention will be described in detail with reference to the accompanying drawings.

Figure 3A:
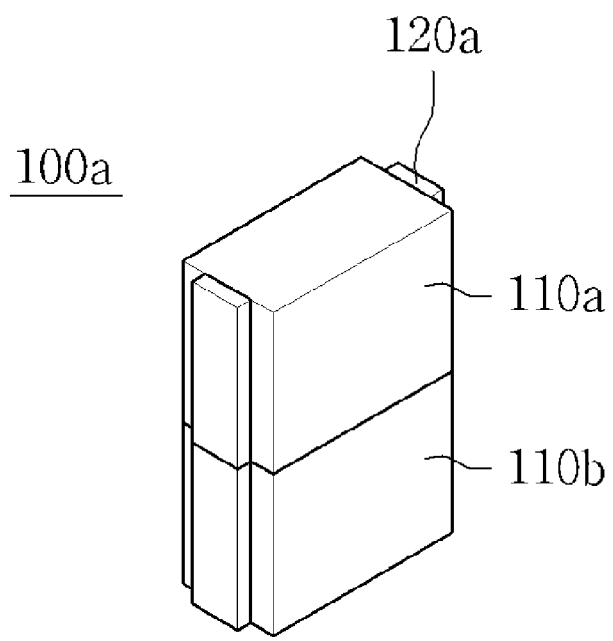
FIGS. 3A and 3B are schematic perspective views illustrating piezo actuators according to the preferred embodiment of the present invention.
Figure 3B:
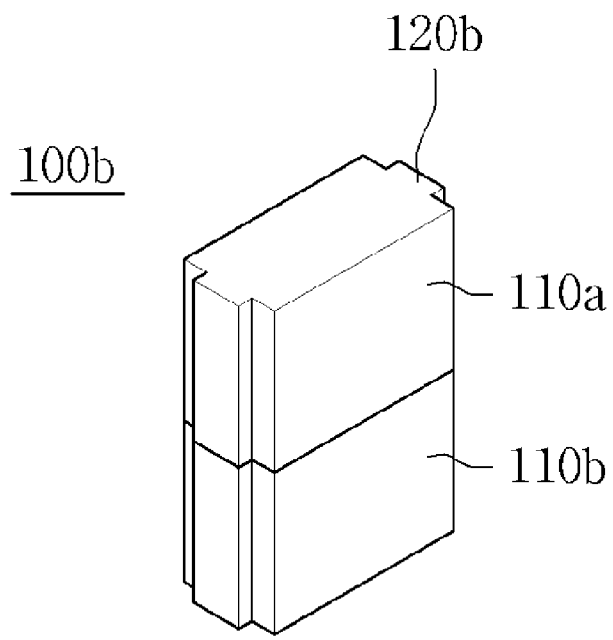
Figure 4A:
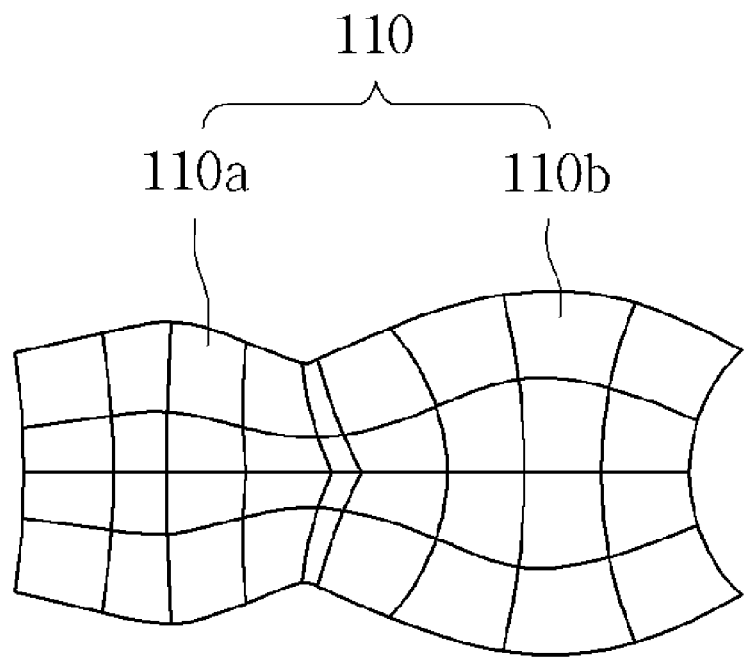
FIGS. 4A and 4B are views illustrating the bent state of the piezo actuators of FIGS. 3A and 3B.
Figure 4B:
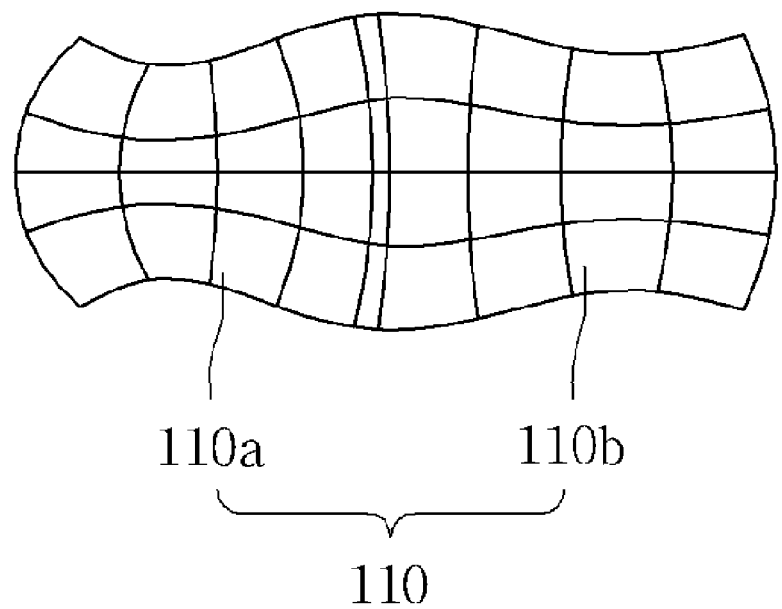

FIGS. 3A and 3B are schematic perspective views illustrating piezo actuators according to the preferred embodiment of the present invention, and FIGS. 4A and 4B are views illustrating the bent state of the piezo actuators of FIGS. 3A and 3B. The structure and bent state of the piezo actuators according to the embodiment will be described below with reference to the accompanying drawings.

As shown in FIGS. 3A and 3B, each of the piezo actuator 100a and 100b according to the embodiment includes box-shaped plates 110a and 110b and guides 120a or 120b. The plates 110a and 110b comprise a piezoelectric material which is divided into two parts each having an independent electrode. The guides 120a or 120b are provided on opposite sides of the plates 110a and 110b. When power is applied to the piezoelectric material, the sides of the plates 110a and 110b are bent and deformed inwards and outwards relative to the plates 110a and 110b, thus generating actuating force in the longitudinal direction of the plates 110a and 110b.

Here, the plates 110a and 110b are constructed to be bent and deformed by applied power, whereas the guides 120a or 120b are constructed so that they are not subjected to power and are not bent and deformed. That is, the guides 120a or 120b function to transmit the actuating force generated by the bending deformation of the plates 110a and 110b to a contact member. As such, the piezo actuator is provided with the guides 120a or 120b, thus preventing the abrasion of the piezoelectric material caused by direct contact friction between the plates 110a and 110b comprising the piezoelectric material and the contact member. Each guide 120a or 120b is formed such that its side contacting the contact member has a round shape, such as a circular shape or a semicircular shape. The guides may be may be manufactured separately from the plates 110a and 110b and secured to the plates 110a and 110b (see FIG. 3A), or integrated with the plates 110a and 110b (see FIG. 3B).

Meanwhile, as shown in FIGS. 4A and 4B, the piezo actuator 100a or 100b according to this embodiment is constructed so that its sides are bent and deformed inwards and outwards relative to the plates 110a and 110b. As such, when the piezo actuator 100a or 100b is bent and deformed, the contact member contacting the side of the piezo actuator 100a or 100b is subjected to actuating force in the longitudinal direction of the plates 110a and 110b. A lens actuating module using the longitudinal actuating force generated by the bending contraction of the piezo actuator 100a or 100b will be described below.

Figure 5:
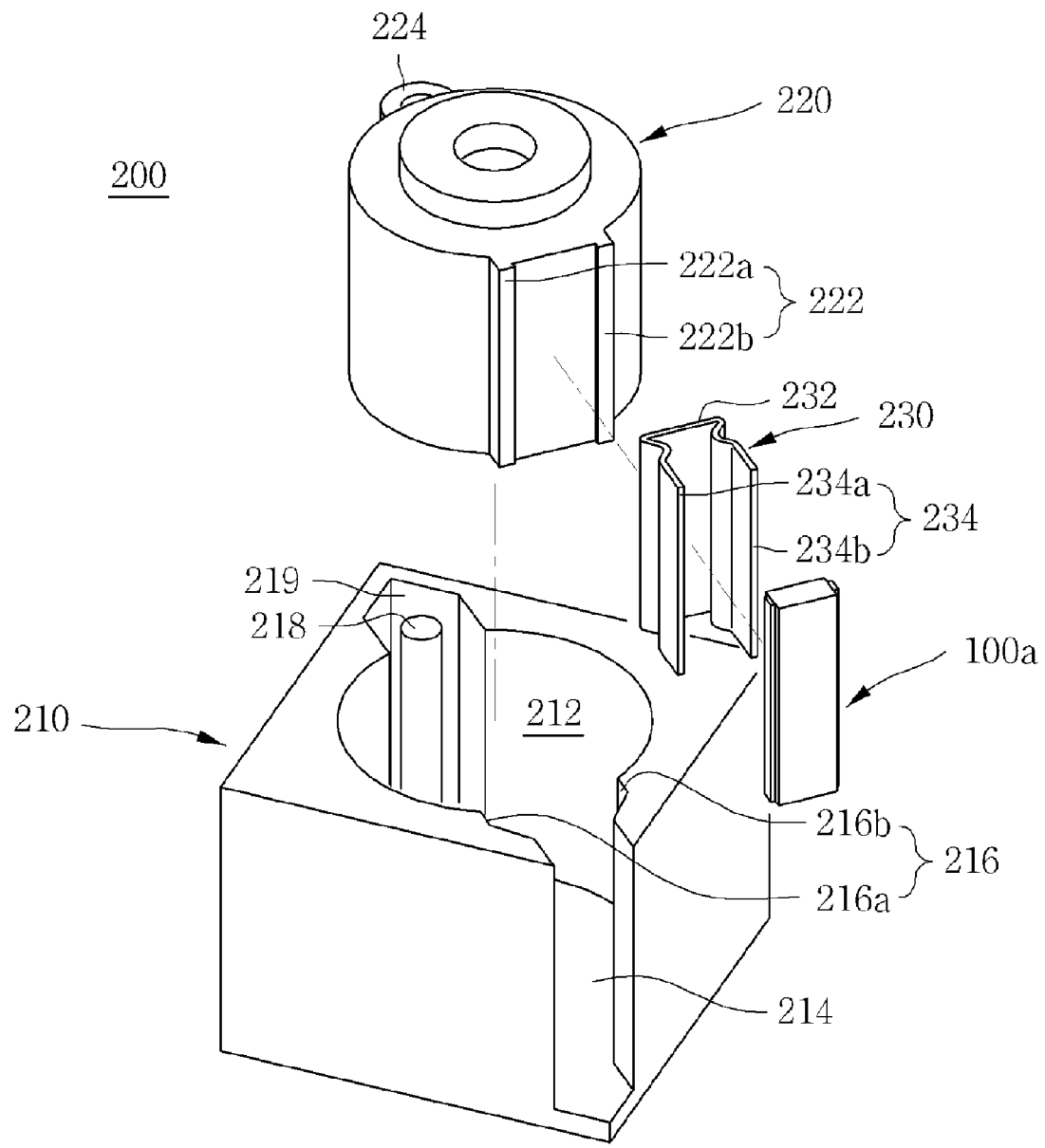
FIG. 5 is an exploded perspective view illustrating a lens actuating module according to the preferred embodiment of the present invention.
Figure 6:
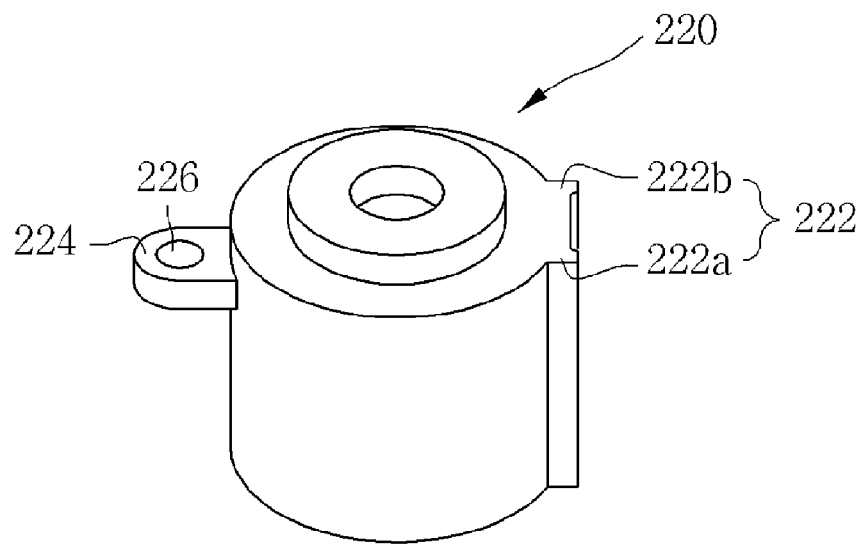
FIG. 6 is a perspective view illustrating a lens barrel of the lens actuating module of FIG. 5.
Figure 7:
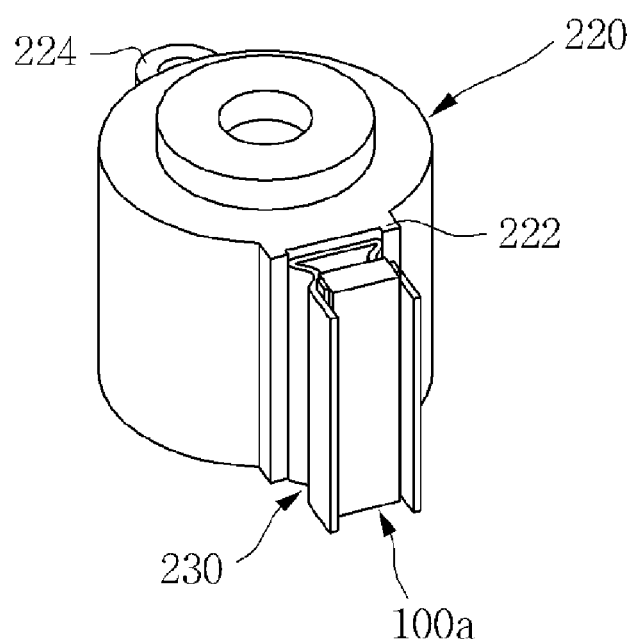
FIG. 7 is a perspective view illustrating the assembled state of the lens barrel, a preload unit, and the piezo actuator of the lens actuating module of FIG. 5.
Figure 8A:
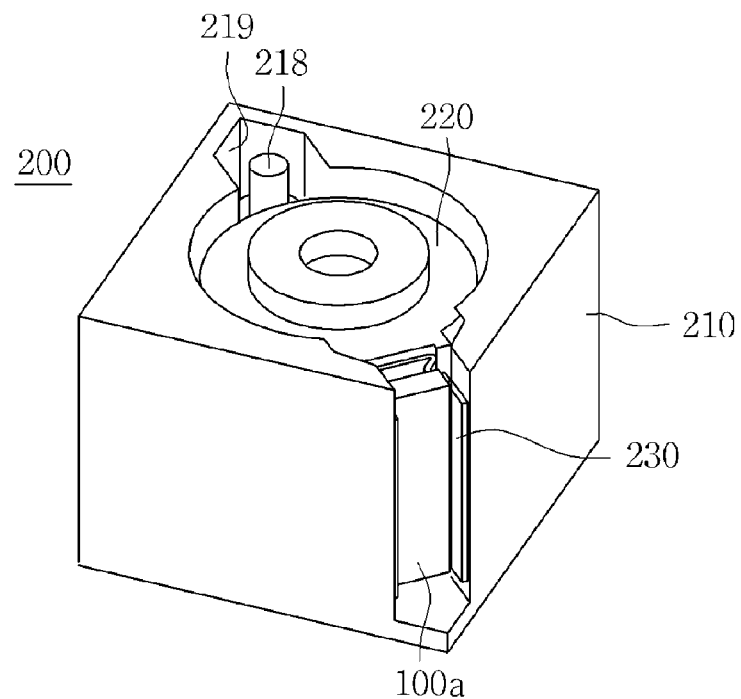
FIGS. 8A and 8B are perspective views illustrating the lens actuating module of FIG. 5.
Figure 8B:
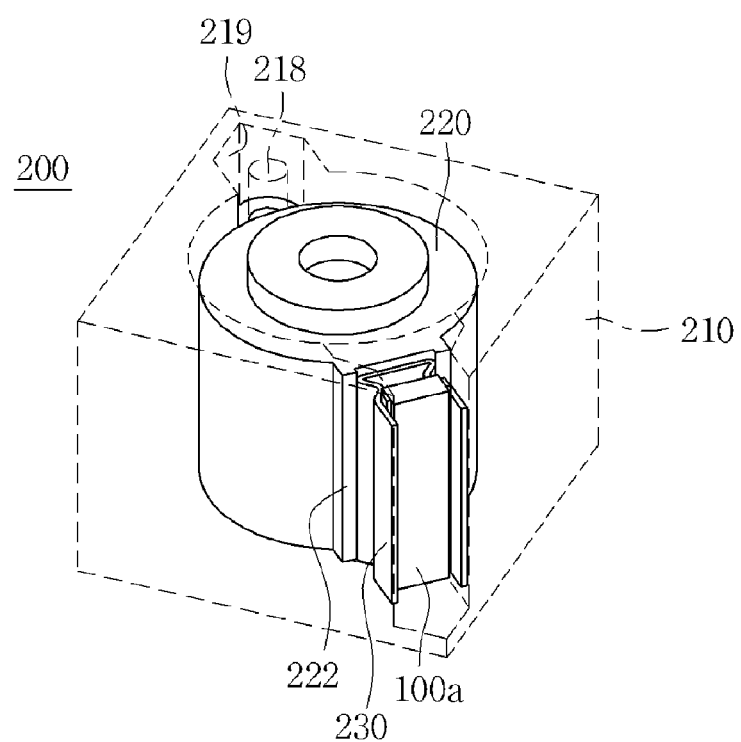
Figure 9:
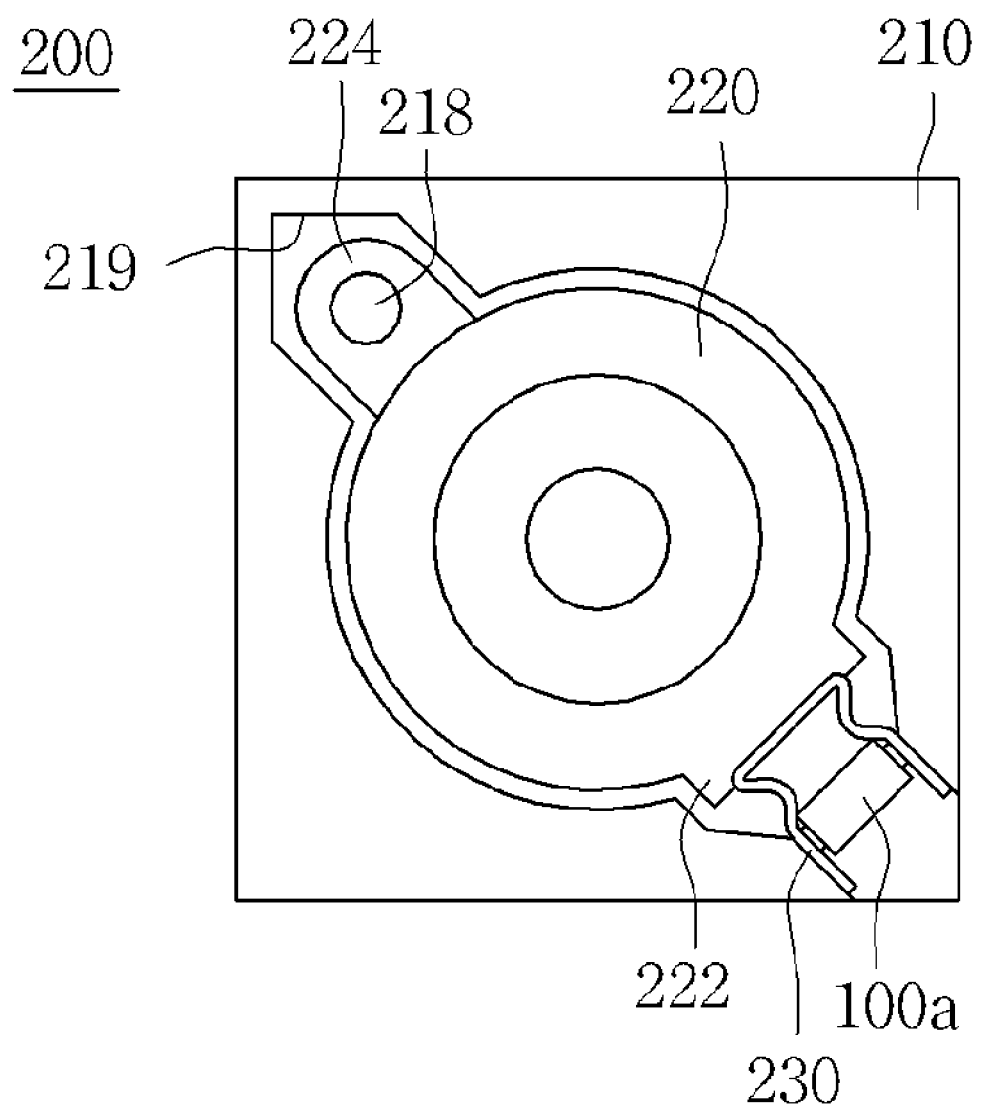
FIG. 9 is a plan view illustrating the lens actuating module of FIG. 5.

FIG. 5 is an exploded perspective view illustrating a lens actuating module according to the preferred embodiment of the present invention, FIG. 6 is a perspective view illustrating a lens barrel of the lens actuating module of FIG. 5, FIG. 7 is a perspective view illustrating the assembled state of the lens barrel, a preload unit, and the piezo actuator of the lens actuating module of FIG. 5, FIGS. 8A and 8B are perspective views illustrating the lens actuating module of FIG. 5, and FIG. 9 is a plan view illustrating the lens actuating module of FIG. 5. Hereinafter, the lens actuating module 200 according to the preferred embodiment of the present invention will be described with reference to the drawings.

As shown in FIGS. 5 to 9, the lens actuating module 200 according to this embodiment includes a housing 210, a lens barrel 220, a preload unit 230, and a piezo actuator 100a or 100b. FIGS. 5 to 9 illustrate an embodiment wherein the piezo actuator 100a of FIG. 3A is used, for convenience's sake.

The housing 210 defines a space for accommodating the lens barrel 220 therein, and is constructed so that its top is open and so that it has an accommodating space 212 having a shape corresponding to the contour of the lens barrel 220 such that the accommodating space 212 is in close contact with the lens barrel 220 to support it. The accommodating space 212 is defined in the central portion of the housing 210. For example, the housing 210 has the shape of a box which is open at its top.

Preferably, an opening 214 is formed in one corner of the housing 210 such the piezo actuator 100a and the preload unit 230 are disposed in the opening 214.

A housing guide part 216 is preferably provided on the inner circumference of the housing 210 provided on opposite sides of the opening 214 to guide a barrel support part 222 which is provided on the outer circumference of the lens barrel 220. The housing guide part 216 is stepped inwards to have the shape of a groove which receives the barrel support part 222, and slidably guides the outer surface of the barrel support part 222 which protrudes from the outer circumference of the lens barrel 220. The housing guide part 216 includes a first housing guide part 216a which is provided on one side of the opening 214, and a second housing guide part 216b which is provided on the other side of the opening 214. That is, the stepped surfaces of the housing guide parts 216a and 216b engage with the outer surface of the barrel support part 222, thus guiding the lens barrel 220 during the insertion and vertical actuation of the lens barrel 220, and preventing the tilt and rotation of the lens barrel 220. Meanwhile, the structure and arrangement of the housing guide part 216 correspond to those of the barrel support part 222 of the lens barrel 220, and it is apparent that this guiding structure may be changed as long as it achieves a guiding function.

Further, the housing 210 has a bush guide 218 which is provided on a corner facing the corner of the housing 210 having the opening 214 in a diagonal direction in such a way as to extend in the direction of an optical axis. That is, the bush guide 218 extends upwards from the bottom of the housing 210 in such a way as to be parallel to the direction of the optical axis. Preferably, the corner of the housing 210 having the bush guide 218 is provided with a stepped groove 219 which is stepped inwards. This ensures the actuating space for a barrel bush 224, because the barrel bush 224 provided on the outer circumference of the lens barrel 220 is engaged with the bush guide 218 and is guided. Meanwhile, the number and arrangement of bush guides 218 correspond to those of the barrel bush 224.

The lens barrel 220 functions to bring an image of a subject into a camera module through a lens, and comprises a hollow cylindrical lens holder having an accommodating space of a predetermined size such that at least one lens is arranged along the optical axis.

Here, the lens barrel 220 has at a predetermined position on its side the barrel support part 222 which provides a space for locking the preload unit 230 and performs a guiding function with respect to the housing 210. The barrel support part 222 protrudes outwards from the lens barrel 220 and extends in the direction of the optical axis. The barrel support part 222 includes a first barrel support part 222a and a second barrel support part 222b which is spaced apart from the first barrel support part 222a by a predetermined interval to define a space for locking the preload unit 230 therein. That is, a space and an inner surface between the first barrel support part 222a and the second barrel support part 222b serve to lock the preload unit 230, and the outer surface of the first and second barrel support parts 222a and 222b engages with the housing guide part 216 of the housing 210, thus guiding the lens barrel 220. That is, the outer surface of the first barrel support part 222a engages with the stepped surface of the first housing guide part 216a, while the outer surface of the second barrel support part 222b engages with the stepped surface of the second housing guide part 216b.

Further, the lens barrel 220 has on its outer circumference the barrel bush 224 in such a way that it is placed to be diagonally opposite to the barrel support part 222 of the lens barrel 220. For example, the barrel bush 224 is provided on the upper end of the outer circumference of the lens barrel 220 in such a way as to protrude outwards, and has an open hole 226 into which the bush guide 218 is inserted. That is, when the lens barrel 220 is vertically actuated by the piezo actuator 100a, the lens barrel 220 does not tilt or rotate because the barrel bush 224 is guided while being inserted into the bush guide 218 formed in the housing 210 in the direction of the optical axis. In FIG. 6, one barrel bush 224 is provided on the upper end of the lens barrel 220, and the position and number of barrel bushes may be changed as necessary. Assuming that a plurality of barrel bushes 224 is provided on the lens barrel 220, preferably, the barrel bushes 224 are arranged at regular intervals to stably support the lens barrel 220, and the bush guides 218 come in the same quantity as the barrel bushes 224 and are provided at positions corresponding to those of the barrel bushes 224.

The preload unit 230 pressurizes the piezo actuator 100a with a predetermined elastic force, so that the preload unit 230 is subjected to actuating force generated by the bending deformation of the piezo actuator 100a, prior to transmitting the actuating force to the lens barrel 220.

For example, the preload unit 230 includes a locking part 232 and a preload part 234. The locking part 232 has the structure of a flat plate. The preload part 234 includes a first preload part 234a which extends from one edge of the locking part 232 outwards relative to the lens barrel 220 while being bent, and a second preload part 234b which extends from the other edge of the locking part 232 outwards relative to the lens barrel 220 while being bent. While both sides of the locking part 232 are supported by the inner surface of the barrel support part 222 formed on the outer circumference of the lens barrel 220, the locking part 232 is attached to the outer circumference of the lens barrel 220 using adhesive means such as an adhesive.

Here, the piezo actuator 100a is elastically supported between the first preload part 234a and the second preload part 234b, and is pressurized by the elastic force of the first and second preload parts 234a and 234b, thus maintaining the contact of the preload parts 234a and 234b with the sides of the piezo actuator 100a, preferably, the guides 120a.

According to the present invention, the preload unit 230 serves to pressurize the piezo actuator 100a, thus maintaining the contact of the preload unit 230 with the piezo actuator 100a. The preload unit 230 is locked to the lens barrel 220, thus driving the lens barrel 220 in the direction of the optical axis when actuating force is transmitted from the piezo actuator 100a to the preload unit 230. As long as the function is achieved, the shape of the preload unit 230 may be changed within the technical scope of the present invention. This also falls within the scope of the present invention.

The piezo actuator 100a converts an electric signal transmitted thereto into a mechanical signal using the piezoelectric material, thus providing actuating force for transferring the lens barrel 220. The piezo actuator 100a is bent and deformed in the longitudinal direction, thus applying the actuating force to the lens barrel 220. Since the detailed structure of the piezo actuator 100a has been described above, the repetitive description will be omitted herein.

The piezo actuator 100*a* is elastically supported by the preload part 234 of the preload unit 230 locked to the lens barrel 220, so that the side of the piezo actuator 100*a* is bent and contracted inwards and outwards, thus transmitting the actuating force to the preload part 234 elastically supporting the piezo actuator in the direction of the optical axis. Here, since the preload unit 230 is locked to the lens barrel 220, the lens barrel 220 is driven in the direction of the optical axis as the preload unit 230 is driven in the direction of the optical axis.

Although not shown in the drawings, it is apparent that an additional circuit member for applying power to the piezo actuator 100*a* may be provided.

As described above, the present invention has a piezo actuator which is formed such that its side is bent and deformed inwards and outwards, and has an actuating mechanism wherein a preload unit contacting the piezo actuator is locked to a lens barrel, so that the preload unit is moved in the optical axis direction of the lens barrel when the piezo actuator is bent and deformed, thus simplifying a structure in comparison with the actuating mechanism of a cam or electromagnetic type, therefore enabling the miniaturization of an optical instrument.

Further, such an actuating mechanism simplifies the structure of a lens actuating module, and allows a lens to be more precisely and stably transferred, thus simplifying an assembling process, and reducing manufacturing cost.

Furthermore, in the state where a bush guide, provided in a housing in such a way as to extend vertically in the direction of an optical axis, is inserted into a barrel bush provided on the outer circumference of a lens barrel, the lens barrel is actuated, thus minimizing the tilt and rotation of the lens barrel.

Further, the piezo actuator is provided with a guide which is not bent and deformed and transmits the bending deformation of a piezoelectric material to a preload unit, thus preventing the abrasion of the piezoelectric material due to direct contact friction of the piezoelectric material with a contact member.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood as falling within the scope of the present invention.

What is claimed is:

1. A lens actuating module, comprising:
   a lens barrel including at least one lens;
   a preload unit including a locking part locked to an outer circumference of the lens barrel and preload parts extending from both edges of the locking part outwards relative to the lens barrel;
   a piezo actuator interposed between the preload parts and supported at a side thereof by force of the preload parts, the side being bent and deformed inwards and outwards, thus applying force for actuating the lens barrel in a direction of an optical axis to the preload unit; and
   a housing forming a space for accommodating the lens barrel therein and constructed leaving its top open, and including at a corner thereof an opening such that the preload unit and the piezo actuator are disposed in the opening.

2. The lens actuating module as set forth in claim 1, wherein a barrel support part is provided on the outer circumference of the lens barrel in such a way as to protrude outwards and extend in the direction of the optical axis, and
   a housing guide part is provided in the housing to engage with and guide the barrel support part.

3. The lens actuating module as set forth in claim 1, wherein a bush guide is provided in the housing in such a way as to extend in the direction of the optical axis of the lens barrel, and
   a barrel bush is provided on the outer circumference of the lens barrel so that the bush guide is inserted into the barrel bush to guide the lens barrel.

4. The lens actuating module as set forth in claim 3, wherein the barrel bush protrudes from an upper end of the outer circumference of the lens barrel, and comprises an open hole into which the bush guide is inserted.

5. The lens actuating module as set forth in claim 1, wherein the locking part of the preload unit is supported by the barrel support part which protrudes outwards from the outer circumference of the lens barrel and extends in the direction of the optical axis.

6. The lens actuating module as set forth in claim 1, wherein the locking part of the preload unit is attached to the outer circumference of the lens barrel using an adhesive.

7. The lens actuating module as set forth in claim 1, wherein the piezo actuator comprises:
   a plate comprising a piezoelectric material which is divided into two parts each having an independent electrode, and having a shape of a box; and
   a guide provided on each of opposite sides of the plate, and contacting with and supported by an associated preload part,
   wherein, when power is applied to the piezoelectric material, a side of the plate is bent and deformed inwards and outwards relative to the plate, so that force for actuating the lens barrel in the direction of the optical axis is applied through the guide to the preload part.

8. The lens actuating module as set forth in claim 7, wherein the guide is integrated with the plate, or is manufactured separately from the plate and secured to the plate.

9. The lens actuating module as set forth in claim 7, wherein a contact portion of the guide with the preload part has a round structure.

\* \* \* \* \*